(12) United States Patent
McClay et al.

(10) Patent No.: US 12,557,351 B2
(45) Date of Patent: Feb. 17, 2026

(54) CIRCUITS HAVING ENHANCED ELECTRICAL ISOLATION

(71) Applicant: Allegro MicroSystems, LLC, Manchester, NH (US)

(72) Inventors: James McClay, Dudley, MA (US); Maxim Klebanov, Palm Coast, FL (US); Sundar Chetlur, Frisco, TX (US); Thomas S. Chung, Kissimmee, FL (US)

(73) Assignee: Allegro MicroSystems, LLC, Manchester, NH (US)

( * ) Notice: Subject to any disclaimer, the term of this patent is extended or adjusted under 35 U.S.C. 154(b) by 612 days.

(21) Appl. No.: 18/045,528

(22) Filed: Oct. 11, 2022

(65) Prior Publication Data

US 2024/0120371 A1    Apr. 11, 2024

(51) Int. Cl.
*H10D 62/10*    (2025.01)
*H10B 41/35*    (2023.01)
*H10D 30/68*    (2025.01)

(52) U.S. Cl.
CPC .......... *H10D 62/114* (2025.01); *H10B 41/35* (2023.02); *H10D 30/683* (2025.01)

(58) Field of Classification Search
CPC .. H10D 62/371; H10D 62/114; H10D 89/601; H10D 30/683; H01L 21/762
See application file for complete search history.

(56) References Cited

U.S. PATENT DOCUMENTS

| | | | |
|---|---|---|---|
| 5,341,342 | A | 8/1994 | Brahmbhatt |
| 6,127,225 | A | 10/2000 | Liu |
| 6,212,103 | B1 | 4/2001 | Ahrens et al. |
| 6,295,229 | B1 | 9/2001 | Chang |
| 6,469,341 | B1 | 10/2002 | Sung et al. |
| 6,963,102 | B2 | 11/2005 | Mori |
| 10,297,605 | B2 | 5/2019 | Wang |
| 2002/0048192 | A1 | 4/2002 | Wang et al. |
| 2006/0262605 | A1 | 11/2006 | Seki et al. |
| 2012/0026793 | A1 | 2/2012 | Lukashevich |

(Continued)

OTHER PUBLICATIONS

U.S. Non-Final Office Action dated Aug. 26, 2024 for U.S. Appl. No. 17/650,418; 18 Pages.

(Continued)

*Primary Examiner* — Davienne N Monbleau
*Assistant Examiner* — Emily Farmer
(74) *Attorney, Agent, or Firm* — DALY, CROWLEY, MOFFORD & DURKEE LLP

(57) ABSTRACT

Methods and apparatus for a device that includes a circuit, such as a memory cell, and an isolation structure to electrically isolate the circuit cell. The isolation structure can include a p-type substrate, a first series of p-type material extending to the p-type substrate, and a second series of p-type material extending to the p-type substrate. The first series of p-type material, the p-type substrate, and the second series of p-type material surrounds a first side, a second side, and a bottom of the circuit cell to electrically isolate the circuit cell with continuous p-type material. In some embodiments, the first series of p-type material comprises p-type well regions. In some embodiments, the first series of p-type material comprises deep trench isolation.

22 Claims, 5 Drawing Sheets

(56) References Cited

U.S. PATENT DOCUMENTS

| | | | | |
|---|---|---|---|---|
| 2012/0037984 A1* | 2/2012 | Yu | ................... | H10D 62/157 |
| | | | | 257/E29.261 |
| 2015/0001639 A1* | 1/2015 | Fujie | ................ | H10D 30/65 |
| | | | | 257/501 |
| 2015/0255595 A1* | 9/2015 | Hebert | ............ | H10D 30/0281 |
| | | | | 438/286 |
| 2019/0259829 A1* | 8/2019 | Mun | ................. | H10D 64/258 |
| 2021/0242193 A1* | 8/2021 | Klebanov | ............ | H02H 9/046 |

OTHER PUBLICATIONS

Response to Non-Final Office Action dated Aug. 26, 2024 for U.S. Appl. No. 17/650,418; Response Filed Nov. 12, 2024; 13 Pages.
U.S. Non-Final Office Action dated May 2, 2025 for U.S. Appl. No. 17/650,418; 25 Pages.
U.S. Appl. No. 17/650,418, filed Feb. 9, 2022, Chung et al.
Pavan et al., "Flash Memory Cells—An Overview;" Proceedings of the IEEE, vol. 85, No. 8; Aug. 1997; 24 Pages.
U.S. Final Office Action dated Jan. 29, 2025 for U.S. Appl. No. 17/650,418; 19 Pages.
Response to Final Office Action dated Jan. 29, 2025 for U.S. Appl. No. 17/650,418; Response Filed Apr. 24, 2025; 11 Pages.
Response to U.S. Non-Final Office Action dated May 2, 2025 for for U.S. Appl. No. 17/650,418; Response Filed Jul. 30, 2025; 11 Pages.
U.S. Final Office Action dated Sep. 11, 2025 for for U.S. Appl. No. 17/650,418; 11 Pages.
Response to U.S. Final Office Action dated Sep. 11, 2025 for for U.S. Appl. No. 17/650,418; Response Filed Sep. 15, 2025; 8 Pages.
U.S. Notice of Allowance dated Oct. 15, 2025 for U.S. Appl. No. 17/650,418; 8 Pages.

* cited by examiner

CIRCUITS HAVING ENHANCED ELECTRICAL ISOLATION

BACKGROUND

As is known in the art, operation of a circuit, such as a memory cell, can be interrupted by stray signals. As will be readily appreciated, cell isolation may be required to achieve reliable operation in electrically harsh environments. Flash memory, for example, is an electronic non-volatile computer memory storage medium that can be electrically programmed, erased, and reprogrammed. Memory cells and other circuits that are not properly isolated from stray voltages and other undesirable signals, can be corrupted and/or destroyed. So called latch-up can prevent proper operation of, and possible destroy, circuitry.

SUMMARY

Example embodiments of the disclosure provide methods and apparatus for electrically isolating circuitry, such as a memory cell. In embodiments, a memory cell, such as a FLASH memory cell, is isolated using a series of p wells from a surface of the cell to a substrate. With this arrangement, the cell is laterally isolated by the p-type layers for enhancing noise immunity and protecting the circuit cell from latch-up conditions.

Example embodiments of the disclosure provide circuit isolation structures to protect a circuit, such as a memory cell, from stray signals. In some embodiments, a device structure includes a vertical isolation structure down to a substrate to laterally isolate circuit cells in the structure from stray, e.g., undesired, signals that can detrimentally affect operation of the circuit cell, such as a memory cell. In embodiments, the circuit cell is surrounded by a continuous layer of p-type material from a first side, a bottom, and a second side. In some embodiments, deep trench isolation (DTI) is provided on sides of the circuit cell down to a substrate to provide electrical isolation. In some embodiments, p-type layers are used in combination with deep trench isolation to enhance noise immunity. Example embodiments of circuit isolation enables automotive grade FLASH operation by reducing leakage and preventing latch-up in the FLASH memory cell.

In one aspect, a device comprises: a circuit cell; and an isolation structure to electrically isolate the circuit cell, the isolation structure comprising: a p-type substrate; a first series of p-type material extending to the p-type substrate; and a second series of p-type material extending to the p-type substrate, wherein the first series of p-type material, the p-type substrate, and the second series of p-type material surrounds a first side, a second side, and a bottom of the circuit cell to electrically isolate the circuit cell with continuous p-type material.

A device can further include one or more of the following features: the first series of p-type material comprises a first p-type well layer, a second p-type well layer and a third p-type well layer, which extends to the p-type substrate, a base layer located between the first p-type well layer and the circuit cell, an n well layer between the base layer and the circuit cell, a p plus layer above the first p-type well layer, an n buried layer extending from third p-type well layer to the second series of p-type layers, a diffusion layer on the n buried layer, the diffusion layer comprises an n epi layer, the n epi layer comprises an active layer, a cell p-type well layer on the n epi layer, a cell n well layer on the cell p-type well layer, the circuit cell includes the cell p-type well, the circuit cell comprises a memory cell, the circuit cell comprises a FLASH memory cell, the first series of p-type material comprises a first deep trench isolation structure and the second series of p-type material comprises a second deep trench isolation structure, the first deep trench isolation structure comprises a dielectric material. the dielectric material comprises an oxide, the first deep trench isolation structure includes a conductive material in the dielectric material to provide a conductive path to the p-type substrate, and/or a third series of p-type material comprising a fourth p-type well layer, a fifth p-type well layer and a sixth p-type well layer, which extends to the p-type substrate, wherein the first deep trench isolation structure is located between the circuit cell and the third series of p-type material.

In another aspect, a method comprises: providing a circuit cell; and providing an isolation structure to electrically isolate the circuit cell, the isolation structure comprising: a p-type substrate; a first series of p-type material extending to the p-type substrate; and a second series of p-type material extending to the p-type substrate, wherein the first series of p-type material, the p-type substrate, and the second series of p-type material surrounds a first side, a second side, and a bottom of the circuit cell to electrically isolate the circuit cell with continuous p-type material.

A method can further include one or more of the following features: the first series of p-type material comprises a first p-type well layer, a second p-type well layer and a third p-type well layer, which extends to the p-type substrate, a base layer located between the first p-type well layer and the circuit cell, an n well layer between the base layer and the circuit cell, a p plus layer above the first p-type well layer, an n buried layer extending from third p-type well layer to the second series of p-type layers, a diffusion layer on the n buried layer, the diffusion layer comprises an n epi layer, the n epi layer comprises an active layer, a cell p-type well layer on the n epi layer, a cell n well layer on the cell p-type well layer, the circuit cell includes the cell p-type well, the circuit cell comprises a memory cell, the circuit cell comprises a FLASH memory cell, the first series of p-type material comprises a first deep trench isolation structure and the second series of p-type material comprises a second deep trench isolation structure, the first deep trench isolation structure comprises a dielectric material. the dielectric material comprises an oxide, the first deep trench isolation structure includes a conductive material in the dielectric material to provide a conductive path to the p-type substrate, and/or a third series of p-type material comprising a fourth p-type well layer, a fifth p-type well layer and a sixth p-type well layer, which extends to the p-type substrate, wherein the first deep trench isolation structure is located between the circuit cell and the third series of p-type material.

BRIEF DESCRIPTION OF THE DRAWINGS

The foregoing features of this invention, as well as the invention itself, may be more fully understood from the following description of the drawings in which.

DETAILED DESCRIPTION

Figure 1:
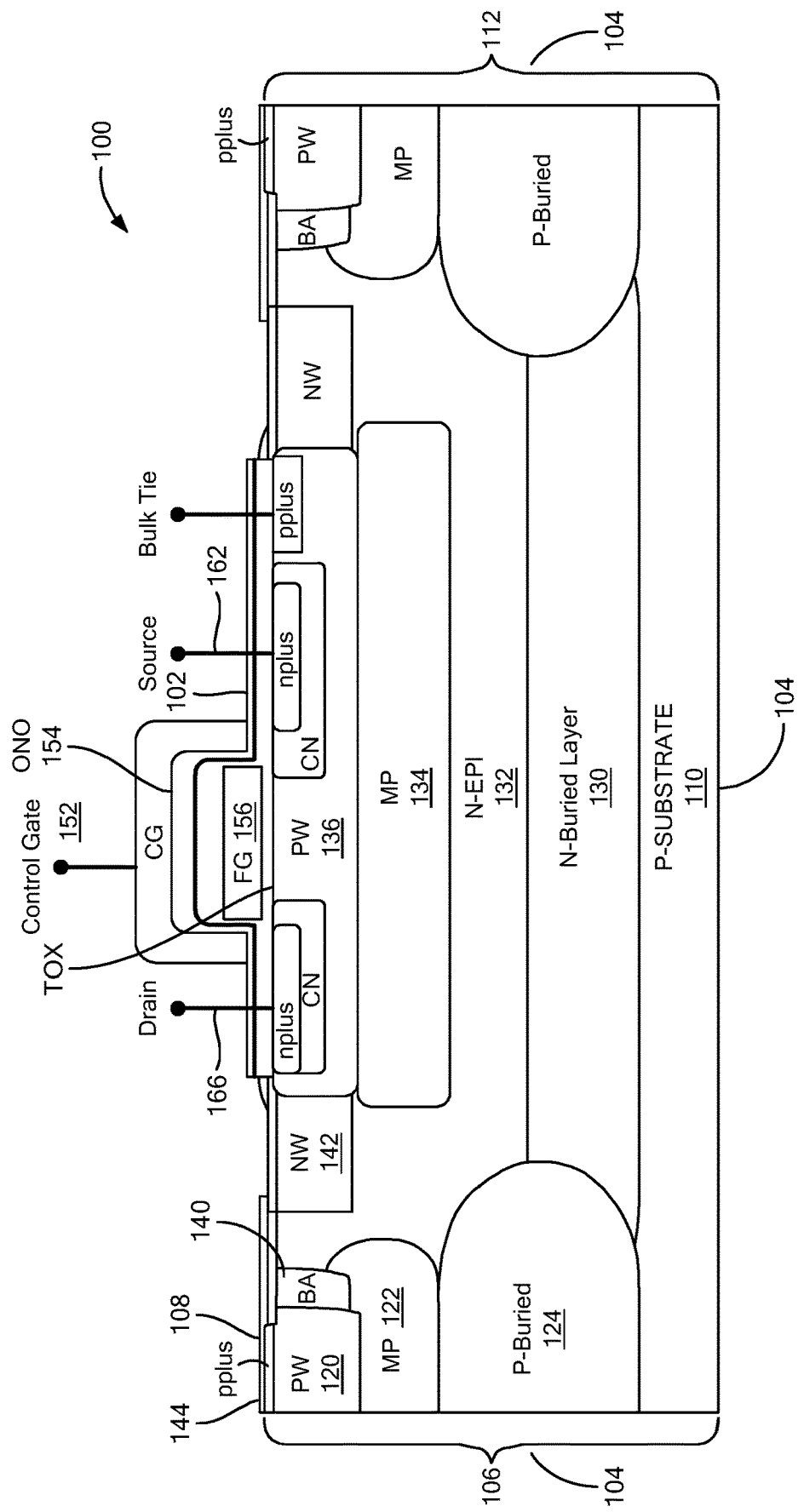
FIG. 1 is a cross-sectional view of a portion of a device including circuitry surrounded by an example circuit isolation structure having p-type wells in accordance with illustrative embodiments of the disclosure.

FIG. 1 is a cross-section of an illustrative device 100 including a circuit cell 102, which is shown as a 1T (1 transistor) FLASH memory cell, with an example electrical isolation structure 104 formed by layers of p-type material. In embodiments, the isolation structure 104 surrounds the sides and bottom of the circuit cell 102 with a continuous layer of p-type material.

In the illustrated embodiment, the isolation structure 104 includes a first series 106 of layers or regions of p-type material that extend from a surface 108 of the device to a p-type substrate 110 on one side of the circuit cell 102 and a second series 112 of p-type layers on the other side of the circuit cell 102. The first series 106 of p-type layers can include a first p-type well 120 on top of a second p-type well 122 on top of a third p-type well 124, which abuts the p-type substrate 110. The second series 112 can include a similar structure to the first series 106 of p-type layers.

In the illustrated embodiment, a n type buried layer (NBL) 130 on top of the substrate 110 can extend from the third p-type well 124 to a corresponding p-type well in the second series 112 of layers, as shown. A diffusion layer 132, such as an n-type epi layer, can be located on top of the NBL 130. In embodiments, the NBL 130 can be heavily implanted by Sb (Antimony) and P (Phosphorus), for example, for contributing to circuit cell isolation from the P-substrate 110.

In embodiments, a further p-type well 134, which can be referred to as a middle p-type well (MP), is located on top of the diffusion layer 132. The MP 134 may be implanted with a dopant to achieve desired characteristics. A cell p-type well 136 can be located on top of the middle p-type well 134, which can support the cell circuitry, as described more fully below.

A base layer (BA) 140, which may be boron-doped, can be located adjacent to the first p-type well 120 and a cell n well 142 can be adjacent one side of the circuit cell 102 aligned with the base layer. In embodiments, a heavily doped p plus (p+) layer 144 can be located on top of the first p-type well 120.

In embodiments, the n-type layers, e.g., 130, 132 are doped to achieve desired characteristics that enhance static (e.g., leakage current) and dynamic (e.g., stray voltages) circuit isolation. The n-type layers can enhance conductivity of the overall structure to promote isolation by lowering resistance of the diffusion layers.

It will be appreciated that it is desirable to increase lateral density of the memory cell, or other circuitry, for maximum density. That, it is desirable to maximum the number of memory cells per unit area. By increasing circuit isolation, cell density can be increased.

It is understood that extrinsic Semiconductors comprise intrinsic semiconductors combined with dopant materials, such as boron or arsenic, that alter the characteristics of intrinsic semiconductors. N-type semiconductors result from the addition of atoms that provide an extra electron so as to have a negative charge. Example n-type dopant materials are typically selected from group V elements, such as Phosphorus and Arsenic. P-type semiconductors are doped with elements, such as Boron and Gallium, which have three electrons in the outer shell (one electron short), so as to have a positive charge. Intrinsic semiconductors can be doped at selected levels to achieve desired electrical, optical, and/or structural properties. Doped or extrinsic semiconductors may exhibit better electrical conductivity than intrinsic semiconductors.

Example embodiments of the isolation structure are applicable to a wide range of circuits, environments, and applications, such as automotive environments. It will be readily appreciated by one of ordinary skill in the art that vehicles, including electric vehicles, may be especially noisy with stray signals that can impact circuit operation. Embodiments of the disclosure may provide desired levels of dynamic isolation in noisy environments.

In embodiments, vertical p-type isolation includes pplus (p+), PW, BA, MP, and PBL (P-buried layer) configured to surround the circuit cell with p-type material. As can be seen, the layers can provide a "snowman" geometry for isolating circuitry from a peripheral circuit area.

In embodiments, this p-type junction isolation goes all the way to touch the p-type substrate and provides over 150V isolation. In example embodiments, the p-type PBL peak doping level is 2e17 deep inside silicon around 8 um.

It is understood that example embodiments of isolation structures may be used for a variety of circuits, such as memory cells, and in particular embodiments FLASH memory cells. Example embodiments having NBL and vertical isolation well structures enable automotive grade FLASH memory operation by shutting down leakages and preventing latch-up from the flash area. This multi-layer isolation structure also improves noise immunity and increases resistance against latch-up that may be required for automotive grade, ESD/EMC solutions.

Flash memory stores information in an array of memory cells made from floating-gate transistors. In single-level cell devices, each cell stores one bit of information. Generally, a flash memory cell includes a control gate stacked above a floating gate. An electrically insulating tunnel oxide layer is located between the floating gate and a semiconductor (e.g., silicon). A source is located on one side of the floating gate in the semiconductor and a drain is located on the other side of the floating gate in the semiconductor. When using silicon as the semiconductor, generally the silicon below the floating gate is doped with a p-type dopant forming a p-type well. It is understood that FLASH memory operation may be disrupted by stray voltages.

A FLASH memory cell functions as an electrical switch in which current flows between the source and drain under the control of a floating gate (FG) and a control gate (CG). The CG operates in a manner similar to the gate G in MOS transistors. The FG, which is under the CG, is insulated all around by an oxide layer, which traps electrons. In general, the FG is interposed between the CG and the MOSFET channel. A charge on the FG screens the field from the CG which increases the threshold voltage of the FLASH cell so that a higher voltage must be applied to the CG to make the channel conductive.

For read operations, an intermediate voltage between the threshold voltages is applied to the CG. If the channel conducts at this intermediate voltage, the FG is uncharged since the presence of a charge would prevent conduction (the intermediate voltage is less than the higher voltage threshold). In this configuration, a logical "1" is stored in the gate. If the channel does not conduct at the intermediate voltage, then the FG is charged indicating that a logical 0 is stored in the gate. The presence of a logical "0" or "1" is sensed by determining whether there is current flowing through the transistor when the intermediate voltage is asserted on the CG. In a multi-level cell device, which stores more than one bit per cell, the amount of current flow is sensed (rather than simply its presence or absence), in order to determine more precisely the level of charge on the FG. The floating gate (FG) is considered as floating because there is an electrically insulating tunnel oxide layer between the floating gate and the silicon so that the gate "floats" above the silicon. The oxide keeps the electrons confined to the floating gate.

Referring again to FIG. 1, the circuit 102 comprises a flash memory cell having a control gate 152 stacked above a floating gate 156 with an oxide compound 154 layer between the control gate 152 and the floating gate 156. The oxide compound 154 may comprise an oxide-nitride-oxide (ONO) material. The cell p-type well 136 may include a source 162 and a drain 166. A tunnel oxide separates the source 162, the p-type well 136 and the drain 166 from the control gate 152, the oxide compound 154 and the floating gate 156. In this configuration, the control gate 152 extends around at least three sides of the floating gate 156. The oxide compound 154 also extends around at least three sides of the floating gate 156 separating the floating gate 156 from the control gate 152. In one example, the source 162 may be a heavily-doped n-type (n+) region, and the drain 166 may be heavily-doped n-type (n+) region. An area of the drain 166 is larger an area of the source 162. In the program mode, the control gate 152 is positively biased, the p-well 136 and the source 162 are zero volts, and the drain 166 is floating. In one particular example, the control gate 152 is biased by 16V. A program post time, $t_{pp}$, or a time the flash memory cell goes from a logical zero to a logical one.

The flash memory cell 102 may be used to erase by moving an electron from the floating gate 156. For example, in an erase mode, an electron path is a path an electron takes from the floating gate 156, through the tunnel oxide to the drain 166. In the erase mode, the control gate 152 is negatively biased, the p-type well 136 and the source 162 are zero volts, and the drain 166 is positively biased. In one particular example, the control gate 152 is biased by −9V and/or the drain 166 is biased by 5V. A program post time, $t_{pp}$, or a time the flash memory cell goes from a logical one to a logical zero.

Figure 2:
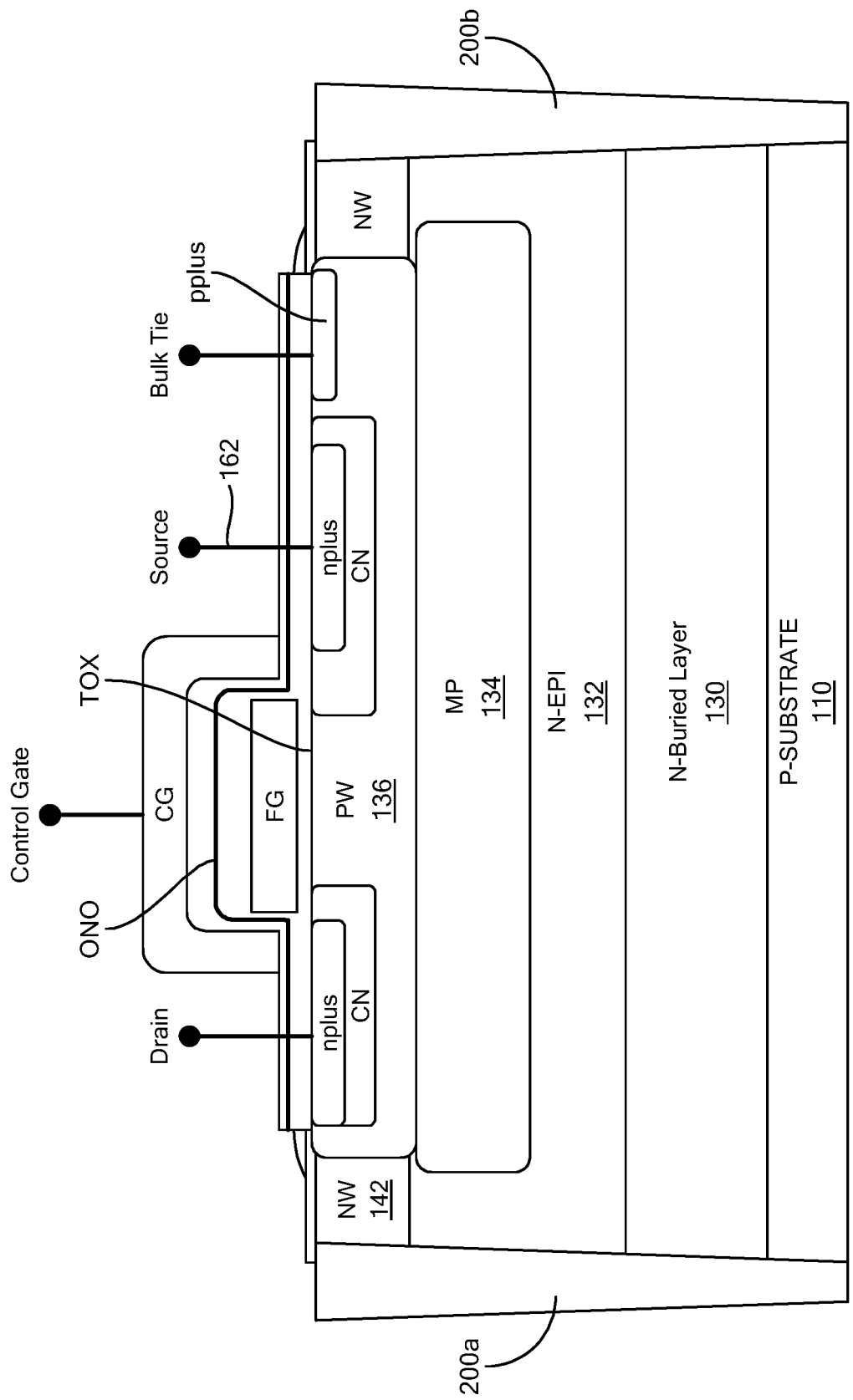
FIG. 2 is a cross-sectional view of a portion of a device including circuitry surrounded by an example circuit isolation structure having deep trench isolation in accordance with illustrative embodiments of the disclosure.

FIG. 2 shows a circuit cell 102 surrounded by a deep trench isolation (DTI) structure 200 having a first trench 200a on one side of the circuit cell down to the p-type substrate 110 and a second trench 200b on the other side of the circuit cell. The DTI structure 200 and the p-type substrate surround the circuit cell to provide electrical isolation. In the illustrated embodiment, the n-type well 142, n-epi layer 132, NBL 130 combine to surround the circuitry 102 and provide a connection to the vertical walls of the DTI structure 200 and the p-type substrate 110.

In embodiments, the DTI structure comprises a dielectric material. In some embodiments, the DTI 200 structure comprises an oxide material. It is understood that any suitable material can be used to meet the needs of a particular application.

Figure 2A:
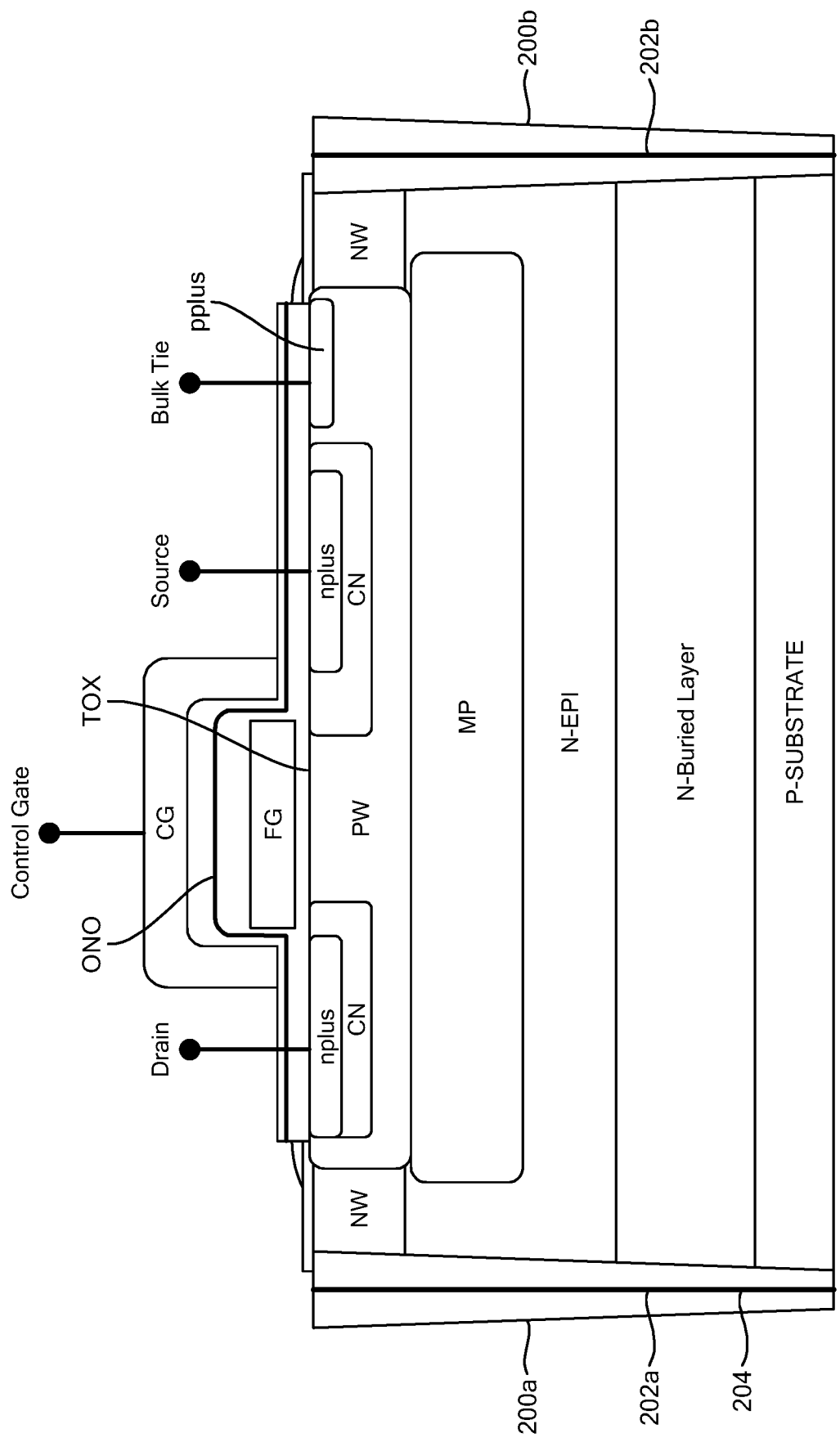
FIG. 2A shows the device of FIG. 2 having channels formed in the deep trench isolation structure.

FIG. 2A shows the device of FIG. 2 with each vertical wall 200a,b of the DTI structure having a channel 202a,b containing a conductive material 204, such as polysilicon, to provide a ground or floating conditions.

Figure 3:
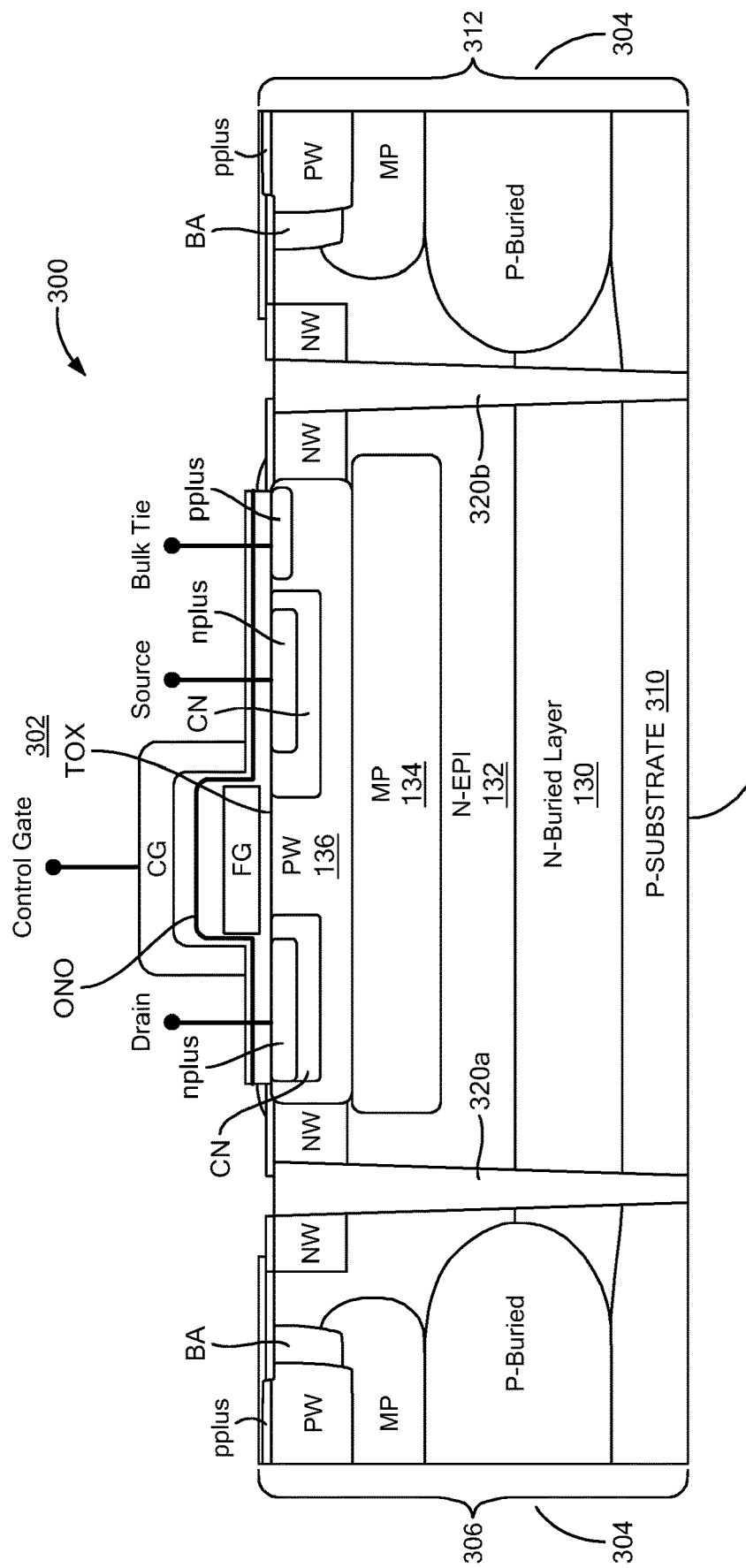
FIG. 3 is a cross-sectional view of a portion of a device including circuitry surrounded by an example circuit isolation structure having p-type well layers and deep trench isolation in accordance with illustrative embodiments of the disclosure.

FIG. 3 shows an example device 300 including a circuit cell 302 electrically isolated by an isolation structure 304 having respective first and second series 306, 312 of p-type layers extending vertically to a p-type substrate 310 to surround the circuit cell 302 and having vertical deep trench isolation (DTI) walls 320a,b on each side of the circuit cell. In the illustrated embodiment, the DTI walls 320a,b are located between the circuit cell 302 and the respective first and second series 306, 312 of p-type layers. With this arrangement, the DTI walls and p-type layers 306, 312 combine to enhance electrical isolation of the circuit cell.

Figure 4:
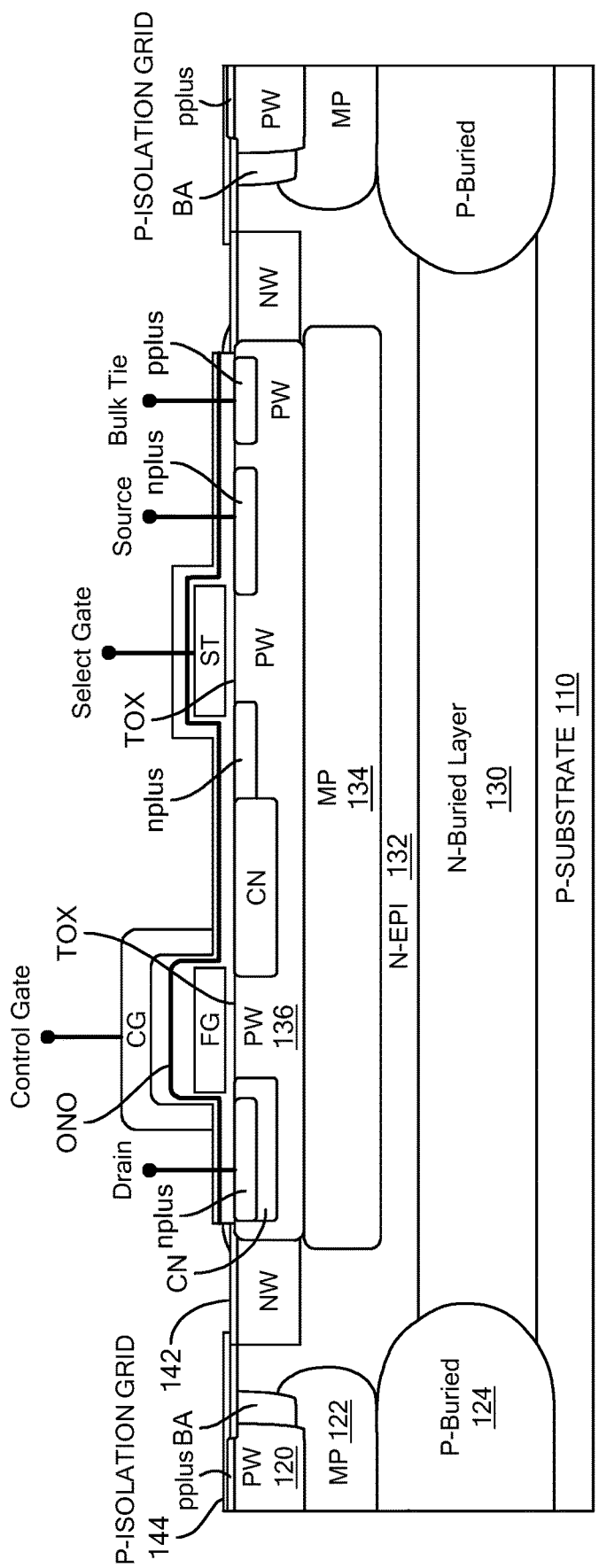
FIG. 4 is a cross-sectional view of a portion of a device including a 2T FLASH memory cell surrounded by an example circuit isolation structure having p-type wells in accordance with illustrative embodiments of the disclosure.

FIG. 4 shows a two-transistor (2T) FLASH cell 402 electrically isolated by a p-type isolation structure that may be similar to the structure 104 shown in FIG. 1, in which like reference numbers indicate like elements.

It is understood that relative terms, such as vertical, may be used herein. It is understood that such terms are intended to facilitate an understanding of the disclosure and should not limit the scope of the invention as claimed in any way.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A device, comprising:
   a circuit cell; and
   an isolation structure to electrically isolate the circuit cell, the isolation structure comprising:
   a p-type substrate;
   a first series of p-type material extending to the p-type substrate;
   a second series of p-type material extending to the p-type substrate, wherein the first series of p-type material, the p-type substrate, and the second series of p-type material surrounds a first side, a second side, and a bottom of the circuit cell to electrically isolate the circuit cell with continuous p-type material, wherein the first series of p-type material comprises a first p-type well layer, a second p-type well layer and a third p-type well layer, which extends to the p-type substrate;
   a doped p-type base layer located between the first p-type well layer and the circuit cell, wherein the base layer contacts the first p-type well layer and the second p-type well layer;
   an n well layer between the base layer and the circuit cell;
   a p plus layer above the first p-type well layer;
   an n buried layer extending from the third p-type well layer of the first series of p-type material to the second series of p-type material; and
   a diffusion layer on the n buried layer, wherein the diffusion layer comprises an n epi layer, wherein the n epi layer contacts the base layer, the n well layer, the second p-type well layer, and the third p-type well layer.

2. The device according to claim 1, wherein the n epi layer comprises an active layer.

3. The device according to claim 2, further including a cell p-type well layer on the n epi layer.

4. The device according to claim 3, further including a cell n well layer on the cell p-type well layer.

5. The device according to claim 4, wherein the circuit cell includes the cell p-type well layer.

6. The device according to claim 1, wherein the circuit cell comprises a memory cell.

7. The device according to claim 1, wherein the circuit cell comprises a FLASH memory cell.

8. The device according to claim 1, wherein the first series of p-type material comprises a first deep trench isolation structure and the second series of p-type material comprises a second deep trench isolation structure.

9. The device according to claim 8, wherein the first deep trench isolation structure comprises a dielectric material.

10. The device according to claim 9, wherein the dielectric material comprises an oxide.

11. The device according to claim 9, wherein the first deep trench isolation structure includes a conductive material in the dielectric material to provide a conductive path to the p-type substrate.

12. A method, comprising:
providing a circuit cell; and
providing an isolation structure to electrically isolate the circuit cell, the isolation structure comprising:
a p-type substrate;
a first series of p-type material extending to the p-type substrate; and
a second series of p-type material extending to the p-type substrate, wherein the first series of p-type material, the p-type substrate, and the second series of p-type material surrounds a first side, a second side, and a bottom of the circuit cell to electrically isolate the circuit cell with continuous p-type material, wherein the first series of p-type material comprises a first p-type well layer, a second p-type well layer and a third p-type well layer, which extends to the p-type substrate;
a doped p-type base layer located between the first p-type well layer and the circuit cell, wherein the base layer contacts the first-p-type first p-type well layer and the second p-type well layer;
an n well layer between the base layer and the circuit cell;
a p plus layer above the first p-type well layer;
an n buried layer extending from the third p-type well layer of the first series of p-type material to the second series of p-type material; and
a diffusion layer on the n buried layer, wherein the diffusion layer comprises an n epi layer, wherein the n-epi n epi layer contacts the base layer, the n well layer, the second p-type well layer, and the third p-type well layer.

13. The method according to claim 12, wherein the n epi layer comprises an active layer.

14. The method according to claim 13, further including employing a cell p-type well layer on the n epi layer.

15. The method according to claim 14, further including employing a cell n well layer on the cell p-type well layer.

16. The method according to claim 15, wherein the circuit cell includes the cell p-type well layer.

17. The method according to claim 12, wherein the circuit cell comprises a memory cell.

18. The method according to claim 12, wherein the circuit cell comprises a FLASH memory cell.

19. The method according to claim 12, wherein the first series of p-type material comprises a first deep trench isolation structure and the second series of p-type material comprises a second deep trench isolation structure.

20. The method according to claim 19, wherein the first deep trench isolation structure comprises a dielectric material.

21. The method according to claim 20, wherein the dielectric material comprises an oxide.

22. The method according to claim 20, wherein the first deep trench isolation structure includes a conductive material in the dielectric material to provide a conductive path to the p-type substrate.

* * * * *